(12) United States Patent
Besaucèle et al.

(10) Patent No.: US 9,779,945 B2
(45) Date of Patent: Oct. 3, 2017

(54) METHOD AND APPARATUS FOR IRRADIATING A SEMICONDUCTOR MATERIAL SURFACE BY LASER ENERGY

(75) Inventors: Hervé Besaucèle, Gennevilliers (FR); Bruno Godard, Les Ulis (FR); Cyril Dutems, Colombes (FR)

(73) Assignee: LASER SYSTEMS & SOLUTIONS OF EUROPE, Gennevilliers (FR)

( * ) Notice: Subject to any disclaimer, the term of this patent is extended or adjusted under 35 U.S.C. 154(b) by 246 days.

(21) Appl. No.: 13/580,902

(22) PCT Filed: Feb. 21, 2011

(86) PCT No.: PCT/EP2011/052498
§ 371 (c)(1),
(2), (4) Date: Oct. 16, 2012

(87) PCT Pub. No.: WO2011/104198
PCT Pub. Date: Sep. 1, 2011

(65) Prior Publication Data
US 2013/0082195 A1    Apr. 4, 2013

(30) Foreign Application Priority Data
Feb. 26, 2010  (EP) .................................... 10290098

(51) Int. Cl.
*G21K 5/04*       (2006.01)
*H01L 21/04*      (2006.01)
(Continued)

(52) U.S. Cl.
CPC ............ *H01L 21/04* (2013.01); *B23K 26/066* (2015.10); *B23K 26/0608* (2013.01);
(Continued)

(58) Field of Classification Search
USPC ..... 250/492.1, 492.2, 492.21, 492.22, 492.23
See application file for complete search history.

(56) References Cited

U.S. PATENT DOCUMENTS 6,373,633 B1 *   4/2002   Brown ............... B23K 26/0604
                                                    359/618
2003/0199176 A1  10/2003  Adachi et al.
(Continued)

FOREIGN PATENT DOCUMENTS

DE    10132840      3/2002
JP    2008264860 A  11/2008

OTHER PUBLICATIONS

International Search Report for PCT/EP2011/052498, Completed by the European Patent Office on Jul. 21, 2011, 5 pages.

*Primary Examiner* — Nicole Ippolito
(74) *Attorney, Agent, or Firm* — Young & Thompson

(57) ABSTRACT

An apparatus for irradiating semiconductor material is disclosed having, a laser generating a primary laser beam, an optical system and a means for shaping the primary laser beam, comprising a plurality of apertures for shaping the primary laser beam into a plurality of secondary laser beams. Wherein the shape and/or size of the individual apertures corresponds to that of a common region of a semiconductor material layer to be irradiated. The optical system is adapted for superposing the secondary laser beams to irradiate said common region. Further, the use of such an apparatus in semiconductor device manufacturing is disclosed.

12 Claims, 6 Drawing Sheets

(51) Int. Cl.
    *B23K 26/06*         (2014.01)
    *B23K 26/067*      (2006.01)
    *B23K 26/073*      (2006.01)
    *G02B 27/09*       (2006.01)
    *B23K 26/066*      (2014.01)
    *H01L 21/268*      (2006.01)

(52) U.S. Cl.
    CPC ........ *B23K 26/0673* (2013.01); *B23K 26/073* (2013.01); *G02B 27/0955* (2013.01); *H01L 21/268* (2013.01)

(56) References Cited

U.S. PATENT DOCUMENTS

| | | | |
|---|---|---|---|
| 2006/0177973 A1 | 8/2006 | Taniguchi et al. | |
| 2006/0233215 A1* | 10/2006 | Casazza | 372/70 |
| 2009/0032511 A1 | 2/2009 | Adams et al. | |
| 2010/0073658 A1* | 3/2010 | Kawai | G03F 1/84 355/67 |

\* cited by examiner

METHOD AND APPARATUS FOR IRRADIATING A SEMICONDUCTOR MATERIAL SURFACE BY LASER ENERGY

CROSS-REFERENCE TO RELATED APPLICATION

This application is the U.S. national phase of PCT Appln. No. PCT/EP2011/052498 filed on Feb. 21, 2011, which claims priority to European Patent Application No. 10290098.2 filed on Feb. 26, 2010, the disclosures of which are incorporated in their entirety by reference herein.

FIELD OF THE INVENTION

The present invention relates to a method of irradiating a semiconductor material surface by means of a laser. Further, it relates to a laser apparatus for irradiating a semiconductor material surface.

BACKGROUND OF THE INVENTION

Laser irradiation of semiconductor material surfaces is well known for applications such as thermal annealing of amorphous silicon to obtain re-crystallization, and dopant activation. This technique offers significant advantages over a conventional heating process by enabling a very fast heat treatment and shallow depth of the heated region.

Since the shape and/or size of the laser beam spot usually does not fit to the shape and/or size of the region to be irradiated, the state of the art provides a number of means for shaping the laser such that a region of a semiconductor material layer with particular size and shape or a pattern of such separated regions can be irradiated. For example, a commonly known technique, as illustrated in US2003199176, is using a shadow mask for shaping the laser beam spot. Such shadow mask may have a plurality of apertures.

Since the laser spot size is much smaller than the size of a die (also called a chip or device) due to the high energy density required for the irradiation process and the low output energy of traditionally available laser sources, a first disadvantage of using the conventional shadow mask technique is that, when a whole die or a big pattern within one die has to be irradiated, the laser spot has to step over or scan the die or the pattern to irradiate it completely. This may result in decreased processing speed and increased production cost.

A second disadvantage is that, if the laser spot scans or steps over the pattern, non-uniformities in dopant activation rate or depth and in surface quality may be generated due to fluctuations in laser energy density.

A third disadvantage is that, in case the size of a continuous pattern, i.e. a pattern of non-separated regions, to be irradiated is greater than the laser beam spot, successive laser spots will overlap at some portions of the pattern causing non-uniformities in dopant activation rate or depth and in surface quality.

Considering the drawbacks of the above laser irradiation processes, there is a clear need for the laser irradiation apparatus according to the present invention, which as a first object may provide the ability to process semiconductor material layers without stepping or scanning over a pattern or a die to completely irradiate it, which may results in increased processing speed and decreased production cost.

As a second object the present invention may provide an apparatus of which the process performance is less dependent on fluctuations in laser energy density and as a consequence achieves increased within die uniformities regarding dopant activation rate or depth and in surface quality.

As a third object the present invention may provide an apparatus allowing the user to control and adjust the shape and/or size of the laser beam spot to the geometry of the region to be irradiated, thereby increasing production rate and production flexibility.

As a fourth object the present invention may provide an apparatus allowing reduction or even suppression of overlap and as a consequence increased uniformities regarding dopant activation rate or depth and surface quality.

As a fifth object, the present invention may limit significantly the number of optical elements required for allowing matching shape and/or size of the beam spot to the region to be irradiated, thus reducing the cost and size of the apparatus.

The present invention meets the above objects by using a primary laser beam which is shaped into a plurality of secondary laser beams by a means for shaping comprising a plurality of apertures of which the shape and/or size corresponds to the shape and/or size of a common region of the semiconductor material layer to be irradiated, and by using an optical system adapted for superposing the secondary laser beams to irradiate said common region.

SUMMARY OF THE INVENTION

The present invention is directed to the apparatus for irradiating semiconductor material comprising:
  a laser generating a primary laser beam;
  an optical system;
  and a means for shaping the primary laser beam, comprising a plurality of apertures for shaping the primary laser beam into a plurality of secondary laser beams;
characterized in that the shape and/or size of the individual apertures corresponds to the shape and/or size of a common region of a semiconductor material layer to be irradiated, and that the optical system is adapted for superposing the secondary laser beams to irradiate said common region.

Further, the present invention is directed to the use of such an apparatus in semiconductor device manufacturing.

DESCRIPTION OF THE INVENTION

Figure 1:
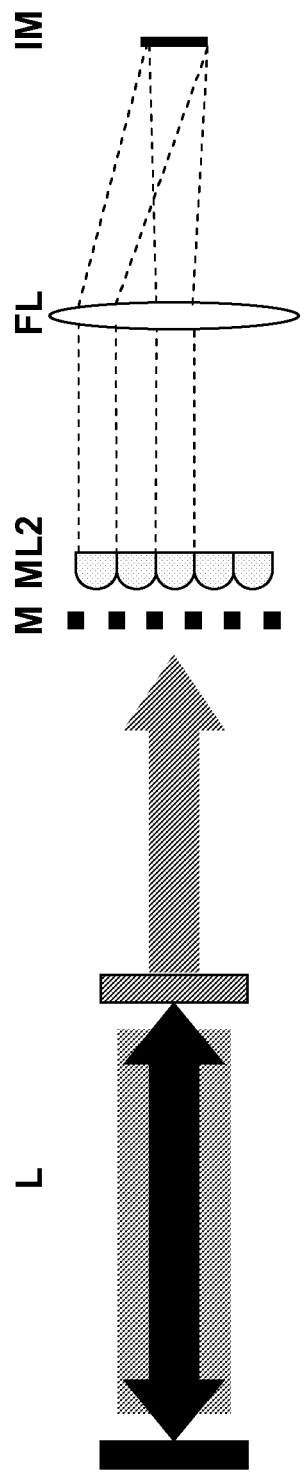
FIG. 1 illustrates an embodiment of an apparatus in accordance with the present invention.

A person skilled in the art will understood that the embodiments described below are merely illustrative in accordance with the present invention and not limiting the intended scope of the invention. Other embodiments may also be considered.

According to a first embodiment of the present invention, an apparatus for irradiating semiconductor material is provided comprising:

a laser generating a primary laser beam;
an optical system;
and a means for shaping the primary laser beam, comprising a plurality of apertures for shaping the primary laser beam into a plurality of secondary laser beams;

characterized in that the shape and/or size of the individual apertures corresponds to the shape and/or size of a common region of a semiconductor material layer to be irradiated, and that the optical system is adapted for superposing the secondary laser beams to irradiate said common region.

By using a primary laser beam which is shaped into a plurality of secondary laser beams by a means for shaping comprising a plurality of apertures of which the shape and/or size corresponds to the shape and/or size of the common region of the semiconductor material layer to be irradiated, and by using an optical system adapted for superposing the secondary laser beams to irradiate said common region, the apparatus provides the ability to process semiconductor material layers without stepping or scanning over a pattern or a whole die to completely irradiate it, which may result in increased processing speed and decreased production cost.

Another advantage may be that the process performance of such apparatus is less dependent on fluctuations in laser energy density since it may irradiate the complete pattern or die in one shot. Moreover, by using an optical system for superimposing the secondary beams, the uniformity of the energy density incident on the region to be irradiated may be improved. As a consequence increased within die uniformities regarding dopant activation rate or depth and surface quality are achieved.

Still another advantage of an apparatus in accordance with the present invention may be that, since the size and/or shape of the apertures corresponds to the region to be irradiated, successive lasers spot are not required anymore, which results in reduction of overlap and as a consequence increased uniformities regarding dopant activation rate or depth and surface quality.

Further, as a skilled person will recognize, an apparatus in accordance with the present invention limits significantly the number of optical elements required for allowing matching shape and/or size of the beam spot to the region to be irradiated compared to conventional systems, thus reducing the cost and size of the apparatus.

The plurality of apertures (also called "mask") may be a solid plate in which a plurality of apertures is manufactured or it may be an assembly of apertures mounted in a frame of any form, preferably in the form of an array. In essence, one such aperture is then a hole or an opening through which part of the primary laser beam passes and which defines the shape and size of the secondary beam spot.

The number of apertures of the plurality of apertures may be from at least two up to M×N, wherein M and N may be from 2 up to 30, from 5 up to 20, and preferentially 10.

Alternatively, the plurality of apertures may be mirror or lens comprising a partially reflective coating having a plurality of higher transmittance areas, i.e the apertures, surrounded by a lower transmittance area. Additionally, by adjusting the transparency of the higher transmittance areas, one can vary the irradiation intensity on the region to be irradiated.

In an embodiment in accordance with the present invention, an apparatus for irradiating semiconductor material is provided, wherein the shape and size of each of the plurality of the apertures is such that the spot shape and spot size of the secondary laser beams match the shape and size of the region to be irradiated. An apparatus in accordance with the present invention may comprise a means for replacing the plurality of apertures by another plurality of apertures of different shape or size. By modifying the aperture shape and size, the size and shape of the secondary beam spots can be substantially exactly matched to the size and shape of the selected region. Such means for replacing may comprise an assembly able to store multiple masks and to accurately and automatically position any of the stocked masks in the primary laser beam path.

In a preferred embodiment of the present invention, the region to be irradiated may correspond to at least one full die. The full die may be treated by one laser pulse. Also, the die could receive multiple laser pulses, all covering the full die. Further, the region to be irradiated may correspond to multiple dies. Irradiating one or more full dies may significantly contribute to increased uniform irradiation energy distribution over the die and to reduction of overlapping effects, resulting in increased process uniformity.

In an embodiment in accordance with the present invention and as illustrated in FIG. 1, the optical system may comprise an array of microlenses (ML2) and a spherical lens (FL). The primary laser beam will be shaped by the plurality of apertures into secondary laser beams which subsequently will be superimposed by the array of microlenses (ML2) and the spherical lens. The spherical lens defines the magnification of the image on the region to be irradiated. Preferably each aperture of the plurality of apertures (M) may correspond substantially exactly with one microlens of ML2, wherein each microlens forms the image (IM) of the corresponding aperture in the infinite plane. Since only one array of microlenses and a spherical lens is required, the number of optical elements is much smaller compared to conventional systems.

Figure 2:
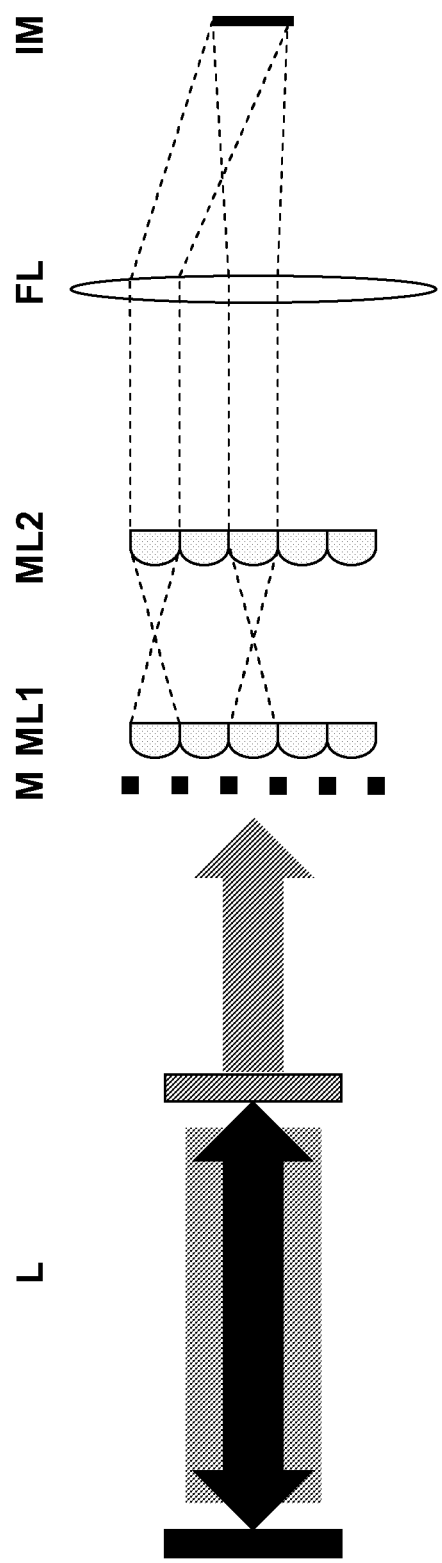
FIG. 2 illustrates another embodiment of an apparatus in accordance with the present invention.

In an embodiment in accordance with the present invention and as illustrated in FIG. 2, the optical system may additionally comprise a second array of microlenses (ML1). So, in this case the optical system comprises two arrays of microlenses (ML1 and ML2) and a spherical lens (FL). The primary laser beam will be shaped by the plurality of apertures in cooperation with ML1 into secondary laser beams which subsequently will be superimposed by ML2 and the spherical lens (FL). Preferably each aperture of the plurality of apertures (M) may correspond substantially exactly with one microlens of ML1, wherein each microlens forms the image of the corresponding aperture in the infinite plane.

Figure 3:
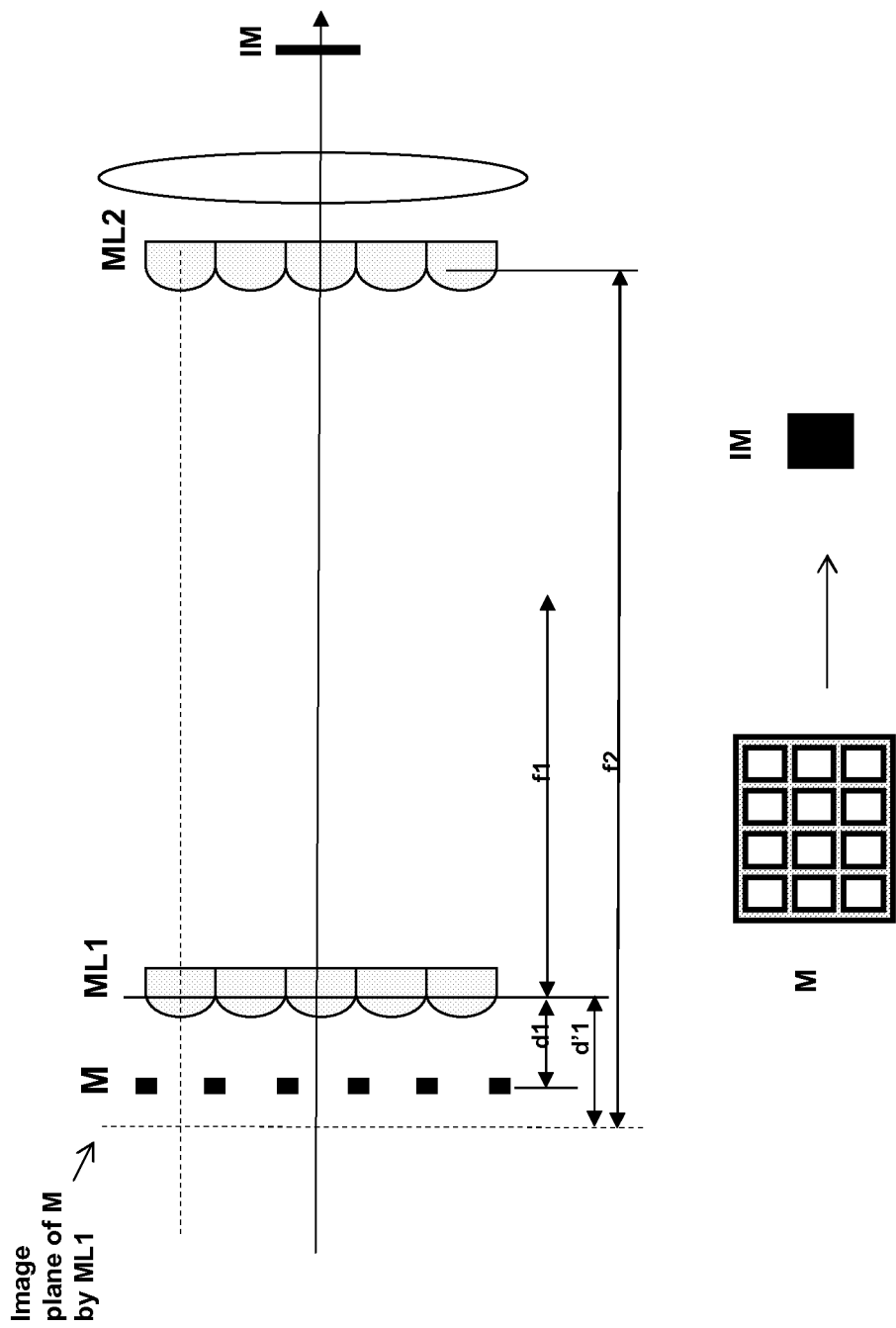
FIG. 3 illustrates a so-called "mini-zoom" in accordance with the present invention.
Figure 4:
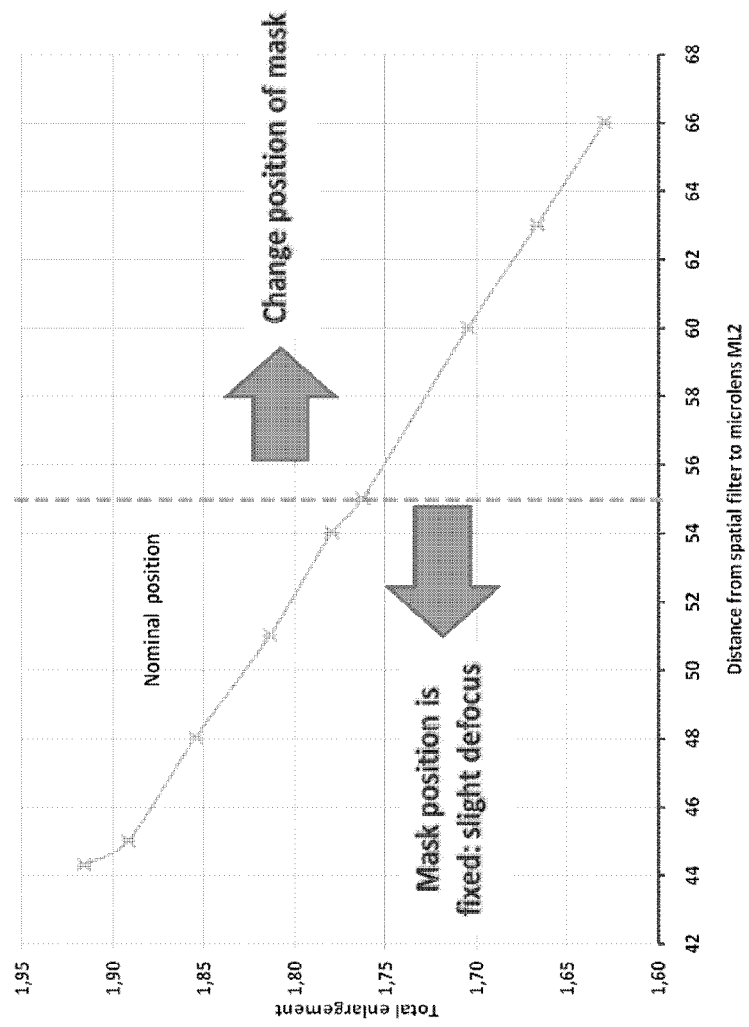
FIG. 4 illustrates the possibilities of accurate focus by means of a "mini-zoom" in accordance with the present invention.

As illustrated in FIG. 3, the latter embodiment has the additional advantage that it may provide fine matching and adjustment of the image size to the region to be irradiating by making ML2 movable relative to ML1 (a so-called "mini zoom"). FIG. 4 shows an example of the range of magnification that can be achieved in this way.

The optical system of the apparatuses in accordance with the present invention serves in fact as a beam homogenizer. By providing the plurality of apertures up-front the optical system, the laser beam is shaped and then homogenized. This provides a significant advantage regarding sharpness of the image compared to a shadow mask approach where a mask is positioned close to the wafer. Moreover, very close position may include a risk for contamination of the semiconductor material substrate.

Figure 5:
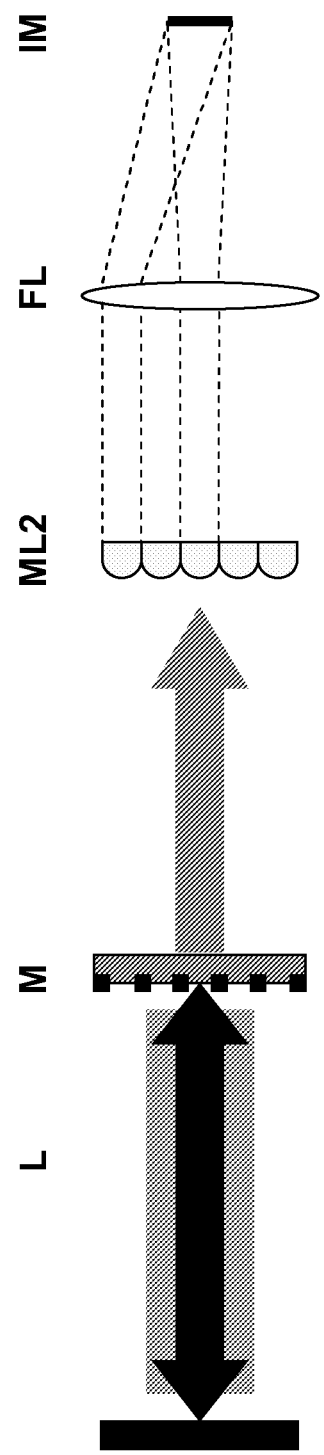
FIG. 5 illustrates an alternative embodiment of an apparatus in accordance with the present invention.

Alternatively and as illustrated in FIG. 5, the plurality of apertures (M) may be located at the inner surface of the output mirror of the laser (L). In this case, the plurality of apertures may be an assembly of apertures mounted as close as possible to the inner surface of the output mirror. A more easy and preferred way of constructing is providing a partially reflective coating on the inner surface of the output mirror having a plurality of higher transmittance areas, i.e. the apertures, surrounded by a lower transmittance area on the inner surface of the output mirror. The latter provides a means for shaping the primary laser beam without loss of energy since the shaping takes place inside the laser.

In a preferred embodiment in accordance with the present invention, the plurality of apertures may be an M×N array of apertures. This M×N array of apertures preferably corresponds to the one or more M×N arrays of microlenses of the beam homogenizer.

Figure 6:
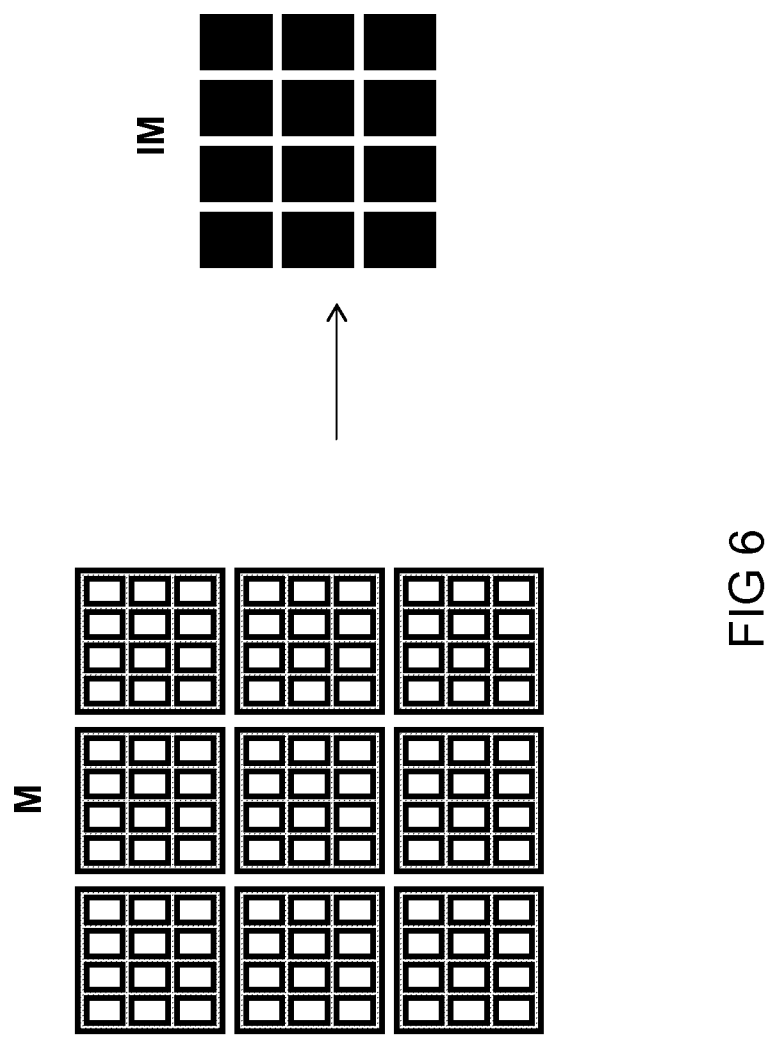
FIG. 6 illustrates a modification of the plurality of apertures.

As illustrated in FIG. 6, the apertures itself may show a pattern. Besides the fact that the shape and/or size of all individual apertures correspond to the shape and/or size of the common region of the semiconductor material layer to be irradiated, at least one of these apertures may show a pattern of lower and higher transmittance zones. The higher transmittance zones of such aperture may even be formed by a pattern of secondary apertures.

As required in some applications, by applying apertures showing such pattern of lower and higher transmittance zones, a controlled non-uniform irradiation may be possible allowing the ability to process in one irradiation pulse a region having sub-regions of different irradiation requirements, e.g. different thermal budget for different activated dopant percentage. Such controlled non-uniform irradiation may be used also to compensate for non-uniformities generated by previous process steps.

The laser may be any laser whose wavelength, energy and pulse duration is adapted to the process. Preferably, the laser may be an excimer layer, more preferably a xenon chloride excimer laser.

The wavelength of the laser may be in the range below 600 nm, in the range of 190 nm to 480 nm due to the high energy absorption of silicon at those wavelengths, and preferably 308 nm.

The laser energy may be in the range of 5 Joules to 25 Joules. In order to achieve these energies, the laser discharge volume is optimized to typically 10 cm (inter electrodes spacing)×7 to 10 cm (discharge width)×100 to 200 cm (discharge length).

The pulse duration corresponds to an optimum between fast heating for reducing diffusion of dopants and relatively slow cool down for reducing the formation of defects, and may be in the range of 100 ns to 1000 ns, preferably between 100 ns and 300 ns.

In an embodiment of the present invention, the laser may be adapted to produce a projected laser beam with an energy density between 0.5 and 10 J/cm$^2$.

In a preferred embodiment, the laser may be an excimer laser adapted to produce a large area output beam of more than 60 cm$^2$, more than 80 cm$^2$, preferably 100 cm$^2$, having a projected beam spot typically from 1 to 10 cm$^2$ with an energy density between 0.5 and 10 J/cm$^2$.

An apparatus according to the invention may further comprise means for aligning the secondary beam spot in XYZ-direction with the plurality of regions.

Further adjustment may be performed by visualizing the beam spot on the semiconductor material layer using a camera, measuring its size and adjusting the magnification.

An apparatus according to the present invention may further comprise a pattern recognition system. Such pattern recognition system may comprise a camera, mechanically linked to a stage for holding the semiconductor material, and positioned above the material layer surface. In a specific embodiment, the image from the camera may be processed to locate several (typically 3) alignment marks that have been etched on the semiconductor material. The alignment marks provide the precise location of the semiconductor material in the coordinate system the apparatus.

The semiconductor material layer may be of any material suitable for semiconductor applications such as, but not limited to undoped silicon, doped silicon, implanted silicon, crystalline silicon, amorphous silicon, silicon germanium, germanium nitride, III-V compound semiconductors such as gallium nitride, silicon carbide, and the like.

The apparatus in accordance with the present invention may be used for making semiconductor material or devices, such as but not limited to CMOS image sensors, 3D memories, CMOS logic devices and photovoltaic cells.

The invention claimed is:

1. An apparatus for irradiating semiconductor material comprising:
   a laser generating a primary laser beam;
   a means for shaping the primary laser beam, comprising a plurality of apertures for shaping the primary laser beam into a plurality of secondary laser beams; and
   an optical system adapted for superposing the secondary laser beams to irradiate a common region of a semiconductor substrate;
   the shape and/or size of the individual apertures corresponding to the shape and/or size of said common region to be irradiated by the superposed secondary laser beams, characterized in that one such aperture is an opening through which part of the primary laser beam passes or a higher transmittance area surrounded by a lower transmittance area.

2. The apparatus according to claim 1, wherein the shape and size of the apertures is such that the spot shape and spot size of the secondary laser beams match the shape and size of said region to be irradiated.

3. The apparatus according to claim 1, wherein the optical system comprises an array of microlenses of which each one of the microlenses corresponds to one of the plurality of apertures, and a spherical lens.

4. The apparatus according to claim 3, wherein the optical system additionally comprises a second array of microlenses of which each one of the microlenses corresponds to one of the plurality of apertures.

5. The apparatus according to claim 1, wherein the laser comprises an output mirror and wherein the plurality of apertures is located at the inner surface of the output mirror.

6. The apparatus according to claim 5, wherein the plurality of apertures comprises a partially reflective coating having a plurality of higher transmittance areas surrounded by a lower transmittance area.

7. The apparatus according to claim 1 wherein the plurality of apertures is an M×N array of apertures.

8. The apparatus according to claim 1 wherein at least one of the apertures shows a pattern.

9. The apparatus according to claim 1, wherein the laser is an excimer laser adapted to produce a projected laser beam with an energy density between 0.5 and 10 J/cm$^2$.

10. The apparatus according to claim 1, wherein the region to be irradiated corresponds to at least one full die.

11. The apparatus according to claim 1, further comprising means for aligning the secondary beam spot in XYZ-direction with the region to be irradiated.

12. Use of an apparatus according to claim 1 in semiconductor device manufacturing.

* * * * *